United States Patent
Steigert et al.

(10) Patent No.: US 11,032,054 B2
(45) Date of Patent: Jun. 8, 2021

(54) SEQUENCED TRANSMIT MUTING FOR WIDEBAND POWER AMPLIFIERS

(71) Applicant: Andrew Wireless Systems GmbH, Buchdorf (DE)

(72) Inventors: Johannes Steigert, Harburg (DE); Patrick Braun, Munningen (DE); Milian Reile, Monheim (DE)

(73) Assignee: Andrew Wireless Systems GmbH, Buchdorf (DE)

( * ) Notice: Subject to any disclaimer, the term of this patent is extended or adjusted under 35 U.S.C. 154(b) by 79 days.

(21) Appl. No.: 16/581,108

(22) Filed: Sep. 24, 2019

(65) Prior Publication Data
US 2020/0127804 A1 Apr. 23, 2020

Related U.S. Application Data

(60) Provisional application No. 62/747,494, filed on Oct. 18, 2018.

(51) Int. Cl.
*H04L 5/14* (2006.01)
*H03F 1/02* (2006.01)
(Continued)

(52) U.S. Cl.
CPC ......... *H04L 5/1461* (2013.01); *H03F 1/0288* (2013.01); *H03F 3/245* (2013.01);
(Continued)

(58) Field of Classification Search
CPC ..... H04L 5/1461; H03F 1/0288; H03F 3/245; H03F 2200/27; H03F 2200/294;
(Continued)

(56) References Cited

U.S. PATENT DOCUMENTS

| 5,392,463 | A | * | 2/1995 | Yamada | H03F 3/24 |
| | | | | | 455/93 |
| 2005/0083129 | A1 | * | 4/2005 | Tsurumaki | H03F 1/301 |
| | | | | | 330/285 |

(Continued)

OTHER PUBLICATIONS

International Searching Authority, "International Search Report and Written Opinion from PCT Application No. PCT/EP2019/077625", from Foreign Counterpart to U.S. Appl. No. 16/581,108, dated Jan. 7, 2020, pp. 1-12, Published: WO.
3GPP, "Evolved Universal Terrestrial Radio Access (E-UTRA); Base Station (BS) radio transmission and reception (3GPP TS 36.104 version 13.5.0 Release 13)", ETSI Technical Specification, Oct. 2016, pp. 1-221, European Telecommunications Standards Institute.

*Primary Examiner* — Robert J Pascal
*Assistant Examiner* — Hafizur Rahman
(74) *Attorney, Agent, or Firm* — Fogg & Powers LLC (57) ABSTRACT

A sequenced transmit muting wideband power amplifier is provided that includes at least one pre-driver stage having at least a first pre-driver and a second pre-driver. A mute switch selectively establishes a communication path between the first and second pre-drivers or couples the second pre-driver to a termination resistor. A pre-driver switch selectively activates/deactivates the first and second pre-drivers. A driver stage is in communication with the pre-driver stage and includes a first driver. A final amplifier stage is in communication with the driver stage and includes at least one second driver. At least one S-NBS switch is configured to selectively activate/deactivate the first driver and second driver. A controller is configured to activate the at least one pre-driver switch, the mute switch, the at least one S-NBS switch to selectively place the amplifier in one of a transmit mode and a mute mode.

19 Claims, 7 Drawing Sheets

(51) Int. Cl.
*H03F 3/24* (2006.01)
*H04J 3/08* (2006.01)

(52) U.S. Cl.
CPC ............ *H04J 3/08* (2013.01); *H03F 2200/27* (2013.01); *H03F 2200/294* (2013.01); *H03F 2200/451* (2013.01); *H03F 2203/21106* (2013.01); *H03F 2203/21142* (2013.01)

(58) Field of Classification Search
CPC ..... H03F 2200/451; H03F 2203/21106; H03F 2203/21142; H04J 3/08
USPC ....................................................... 330/306
See application file for complete search history.

(56) References Cited

U.S. PATENT DOCUMENTS

| | | | |
|---|---|---|---|
| 2008/0285681 A1* | 11/2008 | Sorrells | H03G 3/3042 375/297 |
| 2012/0286866 A1* | 11/2012 | Khanifar | H03F 1/0288 330/149 |
| 2016/0285447 A1 | 9/2016 | Krishnamurthi et al. | |
| 2018/0226932 A1 | 8/2018 | Beaudin et al. | |
| 2019/0222296 A1* | 7/2019 | Khandani | H04B 7/15557 |

\* cited by examiner

SEQUENCED TRANSMIT MUTING FOR WIDEBAND POWER AMPLIFIERS

CROSS-REFERENCE TO RELATED APPLICATIONS

This application claims benefit of U.S. Provisional Patent Application No. 62/747,494 filed on Oct. 18, 2018 and titled "SEQUENCED TRANSMIT MUTING FOR WIDEBAND POWER AMPLIFIERS", the contents of said application are incorporated herein in its entirety.

BACKGROUND

Communication systems implement wideband power amplifiers to amplify communication signals. One type of communication system that uses power amplifiers is a wireless cellular communication system. For example, components in a distributed antenna system (DAS) of a wireless cellular communication implement power amplifiers when processing and communicating signals.

Wireless cellular service providers use base stations to implement wireless communication links with user equipment, such as mobile phones. In particular, a base station is typically in communication with one or more antennas that receive and transmit radio frequency signals to and from user equipment. Each base station in turn is in communication with the service provider's core network. The coverage area of a base station is limited by the transmit power of the associated signals. Moreover, the coverage provided by the transmitted signals is influenced by many other factors such as physical obstacles and interference. Hence, wireless coverage in buildings and stadiums has traditionally been poor when served only from conventional "macro" base stations.

One way that a wireless cellular service provider can improve the coverage provided by a given base station or group of base stations is by using a DAS. In a typical DAS, radio frequency (RF) signals are transported between a master unit and one or more remote antenna units using one or more transport cables. The master unit is communicatively coupled to one or more base stations.

Traditionally, RF signals transmitted from the base stations (also referred to here as "downlink RF signals") are received at the master unit. The master unit uses the downlink RF signals to generate one or more downlink transport signals that are distributed to one or more of the remote antenna units over the transport cables. Each such remote antenna unit receives a downlink transport signal and generates a version of the downlink RF signals based on the downlink transport signal and causes the generated downlink RF signals to be radiated from at least one antenna coupled to or included in that remote antenna unit. A similar process is performed in the uplink direction. RF signals transmitted are from user equipment. These RF signals are also referred to here as "uplink RF signals." Each such uplink RF signal is intended for a base station coupled to the master unit. Each remote antenna unit receives uplink RF signals transmitted from user equipment within its associated coverage area.

Each remote antenna unit uses the received uplink RF signals to generate an uplink transport signal that is transmitted from the remote antenna unit to the master unit over the transport cables. The master unit receives uplink transport signals from the various remote antenna units coupled to it. For each base station coupled to the master unit, the master unit combines uplink signals intended for that base station that are received from the various remote antenna units.

For each base station coupled to the master unit, the master unit ultimately generates uplink RF signals from the combined uplink signals for that base station, which are provided to that base station. Each remote antenna unit can be coupled to each master unit either directly or indirectly via one or more intermediate devices (such as another remote antenna unit or an expansion unit). In this way, the coverage of each base station can be expanded using the DAS.

To address an ever increasing need for bandwidth, air interfaces used in wireless communication systems have often used time division duplexing (TDD). TDD divides a data stream into frames and assigns different time slots to uplink and downlink transmissions, thereby allowing both types of transmissions to share the same transmission medium. TDD is advantageous in situations where there is an asymmetry of uplink and downlink data rates.

Implementing TTD in components that include power amplifiers can be a challenge. A downlink transmit power amplifier needs to be turned off during uplink transmission or interference will occur. A power amplifier typically includes various transistors. If a voltage at even one depletion mode transistor gate equals zero, that transistor is fully conductive allowing strong current flow. Hence it is imperative to ensure the transistors of the power amplifier are not activated when the power amplifier goes into a mute mode during an upload transmission.

SUMMARY

The following summary is made by way of example and not by way of limitation. It is merely provided to aid the reader in understanding some of the aspects of the subject matter described. Embodiments provide a sequential order to deactivate drivers and pre-drivers in a power amplifier. In embodiments, negative-bias-switching (NBS) is used to deactivate the drives and pre-driver switches in bias paths of pre-drivers are used to deactivate the pre-drivers. Further, a mute switch positioned between pre-drivers of pre-driver stages is used to achieve sequenced transmit muting.

In one embodiment, a sequenced transmit muting wideband power amplifier is provided. The power amplifier includes at least one pre-driver stage, a mute switch, at least one pre-driver switch, a driver stage, a final amplifier stage and at least one slow negative-bias switching (S-NBS) switch. The at least one pre-driver stage includes a transmit radio frequency (RF) input and at least a first pre-driver and a second pre-driver. The mute switch is configured to selectively establish a communication path between the first and second pre-drivers and couple the second pre-driver to a termination resistor. The at least one pre-driver switch is used to selectively couple a supply voltage and ground to the first and second pre-drivers. The driver stage is in communication with the at least one pre-driver stage. The driver stage includes at least one first driver. The final amplifier stage includes a transmit RF output and at least one second driver. The at least one S-NBS switch is configured to selectively couple one of a first voltage and a second voltage to the at least one first driver and at least one second driver. The at least one controller configured to activate the at least one pre-driver switch, the mute switch, the at least one S-NBS switch to selectively place the amplifier in one of a transmit mode and a mute mode.

In another example embodiment, another sequenced transmit muting wideband power amplifier is provided. The power amplifier comprising a first pre-driver stage, a first pre-driver switch, a second pre-driver stage, a mute switch, a second pre-driver switch, a driver stage, a first slow negative-bias-switching (S-NBS) switch, a final amplifier stage, a second S-NBS and at least one controller. The first pre-driver stage has a first pre-driver. The first pre-driver has an input that is coupled to receive a radio frequency (RF) input signal. The first pre-driver switch is configured to selectively couple one of a supply voltage and ground to the first pre-driver. The second pre-driver stage has a second pre-driver. The mute switch is configured to selectively couple an input of the second pre-driver to an output of the first pre-driver and the input of the second pre-driver to a termination resistor. The second pre-driver switch selectively couples one of the supply voltage and the ground to the second pre-driver amplifier. The driver stage includes a first driver that is in communication with an output of the second pre-driver stage. The first S-NBS switch is configured to selectively couple one of a first negative voltage and second negative voltage to a first driver gate of the first driver. The final amplifier stage has at least one second driver. The at least one second driver has an input that is coupled to an output of the first driver of the driver stage. The at least one second driver has an output that proves a RF output signal. The second S-NBS switch is configured to selectively couple one of the first negative voltage and the second negative voltage to a second driver gate of the second driver. The at least one controller is configured to activate the first pre-driver switch, the second pre-driver switch, the mute switch, the first S-NBS and the second S-NBS switches to selectively place the amplifier in one of a transmit mode and a mute mode.

In yet another embodiment, a method of operating a sequenced transmit muting wideband power amplifier in a time division duplex communication system is provided. The method includes upon detecting an end of a receive frame, activating at least one negative-bias-switching (S-NBS) switch to couple a select first voltage on gates of drivers in a driver stage and a final amplifier stage of the amplifier; activating a mute switch to establish a communication path between a radio frequency (RF) input and a RF output after a select period of time from the activation of the at least one S-NBS switch; and activating first and second pre-driver switches to couple a supply voltage to pre-driver gates of a first and a second pre-driver that are within the communication path after the select period of time from the activation of the at least one S-NBS switch to place the amplifier in the transmit mode.

BRIEF DESCRIPTION OF THE DRAWINGS

In accordance with common practice, the various described features are not drawn to scale but are drawn to emphasize specific features relevant to the subject matter described. Reference characters denote like elements throughout Figures and text.

DETAILED DESCRIPTION

In the following detailed description, reference is made to the accompanying drawings, which form a part hereof, and in which is shown by way of illustration specific embodiments in which the inventions may be practiced. These embodiments are described in sufficient detail to enable those skilled in the art to practice the embodiments, and it is to be understood that other embodiments may be utilized and that changes may be made without departing from the spirit and scope of the present invention. The following detailed description is, therefore, not to be taken in a limiting sense, and the scope of the present invention is defined only by the claims and equivalents thereof.

It will be understood that when an element is referred to as being "coupled" to another element, it can be coupled directly to the other element, or intervening elements may also be present. In contrast, when an element is referred to as being "directly coupled" to another element, there are no intervening elements present. Further it will be understood the terms "coupled to" in the context described below may refer to a "communication coupling" between elements which may be a direct communication or may include communications through intervening elements unless expressly referred to as "directly coupled."

Embodiments provide a sequenced transmit muting wideband power amplifier that is stable and provides improved efficiency in a time division duplex (TTD) mode Embodiments provide a sequential order to deactivate drivers and pre-drivers in a power amplifier. In embodiments, negative-bias-switching (NBS) is used to deactivate the drives (driver and final amplifier drivers) and pre-driver switches in bias paths of pre-drivers are used to deactivate the pre-drivers. Further, a mute switch positioned between pre-drivers of pre-driver stages is used to achieve sequenced transmit muting. Such power amplifiers may be used, for example, in repeaters and remote antenna units of a distributed antenna system (DAS).

Figure 1A:
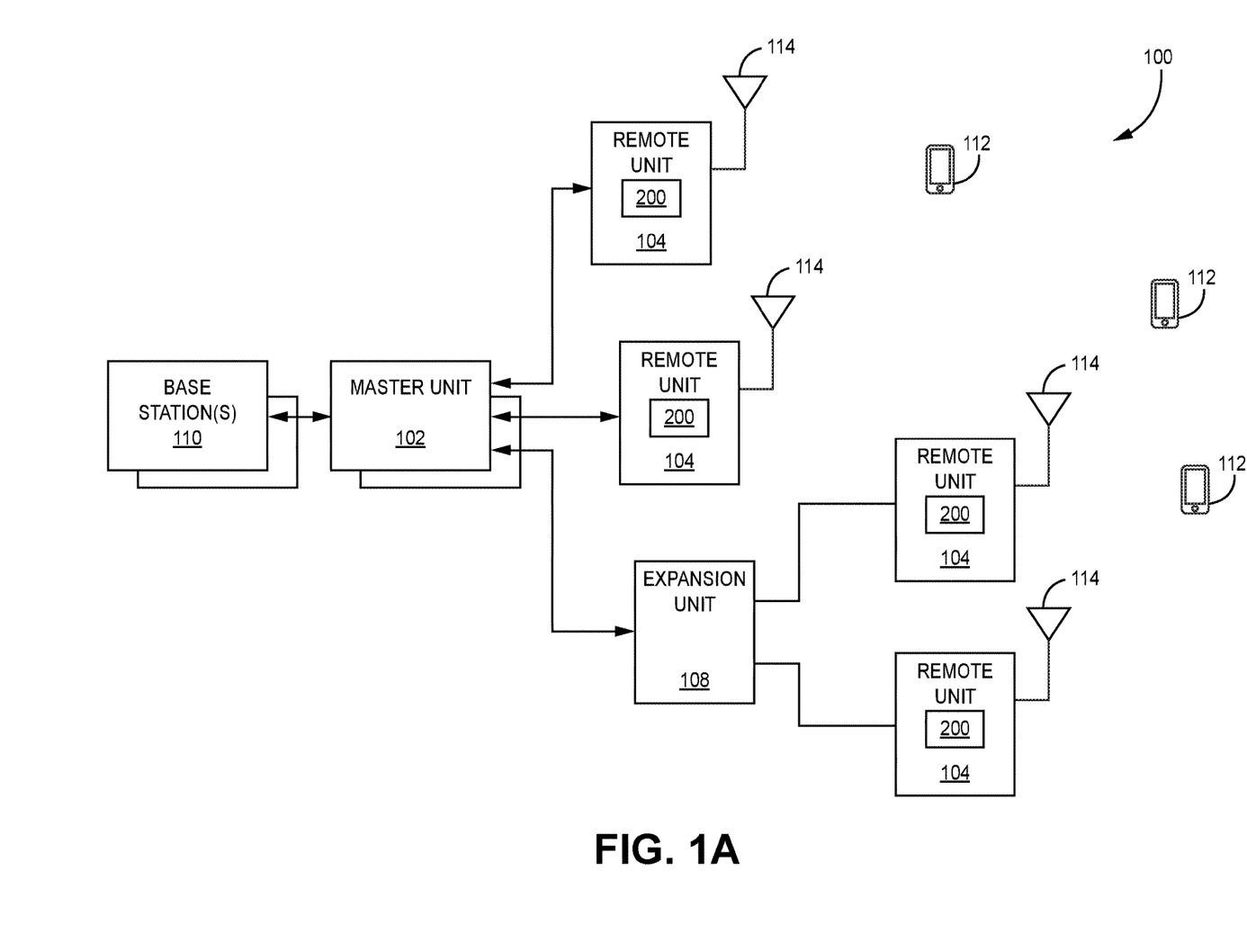
FIG. 1A is block diagram of a distributed antenna system (DAS) that includes sequenced transmit muting wideband power amplifiers according to one exemplary embodiment.

An example of a DAS 100 that includes sequenced transmit muting wideband power amplifiers 200 (STMWPA) in remote antenna units 104 is illustrated in FIG. 1A. The DAS 100 comprises one or more master units 102 that are communicatively coupled to one or more remote antenna units 104 via one or more cables 106. Each remote antenna unit 104 can be communicatively coupled directly to one or more of the master units 102 or indirectly via one or more other remote antenna units 104 and/or via one or more expansion (or other intermediary) unit 108.

Each master unit 102 is communicatively coupled to one or more base stations 110. One or more of the base stations 110 can be co-located with the respective master units 104 to which they are coupled (for example, where each base station 110 is dedicated to providing base station capacity to the system 100 and is coupled to the respective master units 102). Also, one or more of the base stations 110 can be located remotely from the respective master units 102 to which it is coupled (for example, where the base station 110 provides base station capacity to an area beyond the coverage area of the DAS 100). In this latter case, the master unit 102 can be coupled to a donor antenna and repeater or bi-directional amplifier in order to wirelessly communicate with the remotely located base station 110.

The base stations 110 can also be coupled to the master units 102 using a network of attenuators, combiners, splitters, amplifiers, filters, cross-connects, etc., (sometimes referred to collectively as a "point-of-interface" or "POI"). This network can be included in the master units 102 and/or can be separate from the master units 102. This is done so that, in the downlink, the desired set of RF channels output by the base stations 110 can be extracted, combined, and routed to the appropriate master units 102, and so that, in the upstream, the desired set of carriers output by the master units 102 can be extracted, combined, and routed to the appropriate interface of each base station 110. It is to be understood, however, that this is one example and that other embodiments can be implemented in other ways.

In general, each master unit 102 comprises downlink DAS circuitry that is configured to receive one or more downlink signals from one or more base stations 110. Each base station downlink signal includes one or more radio frequency channels used for communicating in the downlink direction with user equipment 112 over the relevant wireless air interface. Typically, each base station downlink signal is received as an analog radio frequency signal, though in some embodiments one or more of the base station signals are received in a digital form (for example, in a digital baseband form complying with the Common Public Radio Interface ("CPRI") protocol, Open Radio Equipment Interface ("ORI") protocol, the Open Base Station Standard Initiative ("OBSAI") protocol, or other protocol).

The downlink DAS circuitry in each master unit 102 is also configured to generate one or more downlink transport signals derived from one or more base station downlink signals and to transmit one or more downlink transport signals to one or more of the remote antenna units 104.

Each remote antenna unit 104 comprises downlink DAS circuitry that is configured to receive the downlink transport signals transmitted to it from one or more master units 102 and to use the received downlink transport signals to generate one or more downlink radio frequency signals that are radiated from one or more coverage antennas 114 associated with that remote antenna unit 104 and/or expansion unit 108 for reception by user equipment 112. In this way, the DAS 100 increases the coverage area for the downlink capacity provided by the base stations 110.

Also, each remote antenna unit 104 and expansion unit 108 may comprises uplink DAS circuitry that is configured to receive one or more uplink radio frequency signals transmitted from the user equipment 112. These signals are analog radio frequency signals.

The uplink DAS circuitry in each remote antenna unit 104 and expansion unit may also be configured to generate one or more uplink transport signals derived from the one or more remote uplink radio frequency signals and to transmit one or more uplink transport signals to one or more of the master units 102.

Each master unit 102 comprises uplink DAS circuitry that is configured to receive the respective uplink transport signals transmitted to it from one or more remote antenna units 104 and to use the received uplink transport signals to generate one or more base station uplink radio frequency signals that are provided to the one or more base stations 110 associated with that master unit 102. Typically, this involves, among other things, combining or summing uplink signals received from multiple remote antenna units 104 in order to produce the base station signal provided to each base station 110. In this way, the DAS 100 increases the coverage area for the uplink capacity provided by the base stations 110.

In some embodiments (for example, the one shown in FIG. 1A), one or more of the remote antenna units 104 are coupled to a master unit 102 via one or more intermediate units 108 (also referred to as "expansion nodes"). This can be done, for example, in order to increase the number of remote antenna units 104 that a single master unit 102 can feed, to increase the master-unit-to-remote-antenna-unit distance, and/or to reduce the amount of cabling needed to couple a master unit 102 to its associated remote antenna units 104. The expansion units 108 are coupled to the master unit 102 and the remote antenna units 104 via one or more transport cables. Each expansion unit 108 comprises downlink DAS circuitry that is configured to receive the downlink transport signals transmitted to it from the master unit 102 (or other expansion unit 108) and transmits the downlink transport signals to one or more remote antenna units 104 or other downstream expansion units 108. Each expansion unit 108 also comprises uplink DAS circuitry that is configured to receive the respective uplink transport signals transmitted to it from one or more remote antenna units 104 or from other downstream expansion units 108, combine or sum the received uplink transport signals, and transmit the combined uplink transport signals upstream to the master unit 102 or other expansion unit 108.

In other embodiments, one or more remote antenna units 104 are coupled to one or more master units 102 via one or more other remote antenna units 104 (for examples, where the remote antenna units 104 are coupled together in a daisy chain or ring topology).

The downlink DAS circuitry and uplink DAS circuitry in each master unit 102, remote antenna unit 104, and expansion unit 108, respectively, can comprise one or more appropriate connectors, attenuators, combiners, splitters, amplifiers, filters, duplexers, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink DAS circuitry and uplink DAS circuitry may share common circuitry and/or components.

The DAS 100 can use digital transport, analog transport, or combinations of digital and analog transport for generating and communicating the transport signals between the master units 102, the remote antenna units 104, and any expansion units 108.

In such a DAS embodiment, one or more of the master unit 102, the remote antenna unit 104, or the expansion unit 108 can be implemented at least in part using components that are mounted in a rack or sub-rack.

As stated above, embodiments provide a STMWPA 200 (power amplifier) having TDD requirements such as power amplifiers used in remote antenna units 104 of DAS 100. An example of a remote antenna unit 104 implementing an amplifier 200 is illustrated in the remote antenna unit block diagram of FIG. 1B. As illustrated, the remote antenna unit 104, in this example includes a controller 150 and amplifier 200.

Figure 1B:
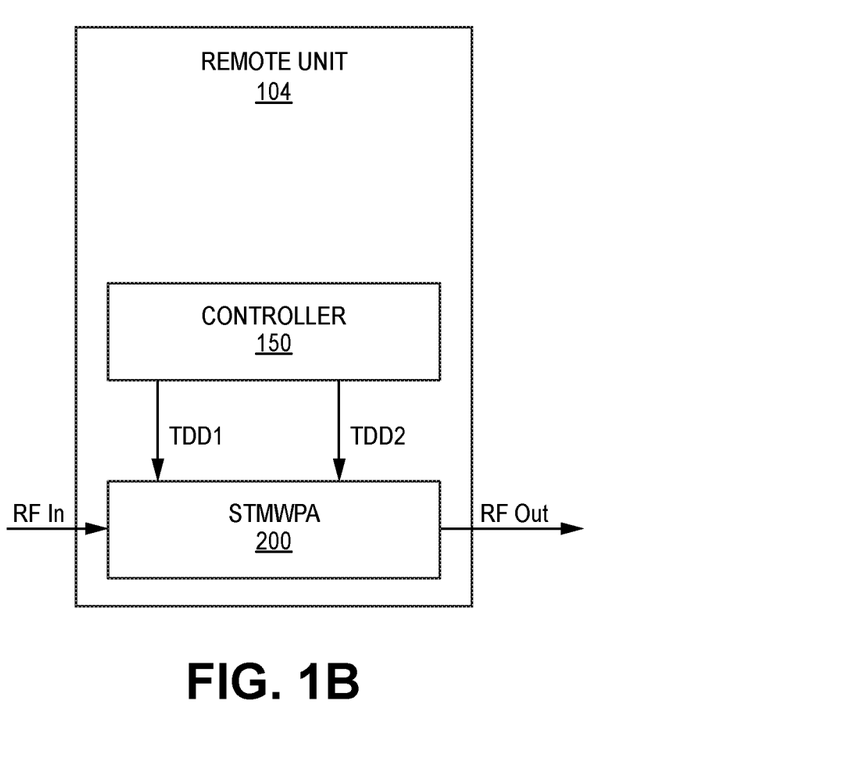
FIG. 1B is a block diagram of a remote antenna unit of a DAS that includes a sequenced transmit muting wideband power amplifier according to one exemplary embodiment.

The controller 150 is configured to generate a first TDD signal (TTD1) and a second TDD signal (TTD2) based on timing discussed below in detail. The controller 150 may be a field programmable array (FPGA) used in the remote antenna unit 104. In other embodiments, the controller 150 may be another type of controller that may include any one or more of a processor, microprocessor, a digital signal processor (DSP), an application specific integrated circuit (ASIC), or equivalent discrete or integrated logic circuitry. In some example embodiments, the controller 150 may include multiple components, such as any combination of one or more microprocessors, one or more controllers, one or more DSPs, one or more ASICs, one or more FPGAs, as well as other discrete or integrated logic circuitry. The functions attributed to the controller 150 herein may be embodied as software, firmware, hardware or any combination thereof. A memory storing function instructions include computer-readable operating instructions that, when executed by the controller 150 provides functions of the TDD signal generator. Such functions may include the functions of signal generating timing of TDD1 and TDD2 described below. The computer readable instructions may be encoded within the memory. The memory may comprise computer readable storage media including any volatile, nonvolatile, magnetic, optical, or electrical media, such as, but not limited to, a random access memory (RAM), read-only memory (ROM), non-volatile RAM (NVRAM), electrically-erasable programmable ROM (EEPROM), flash memory, or any other storage medium.

Figure 2:
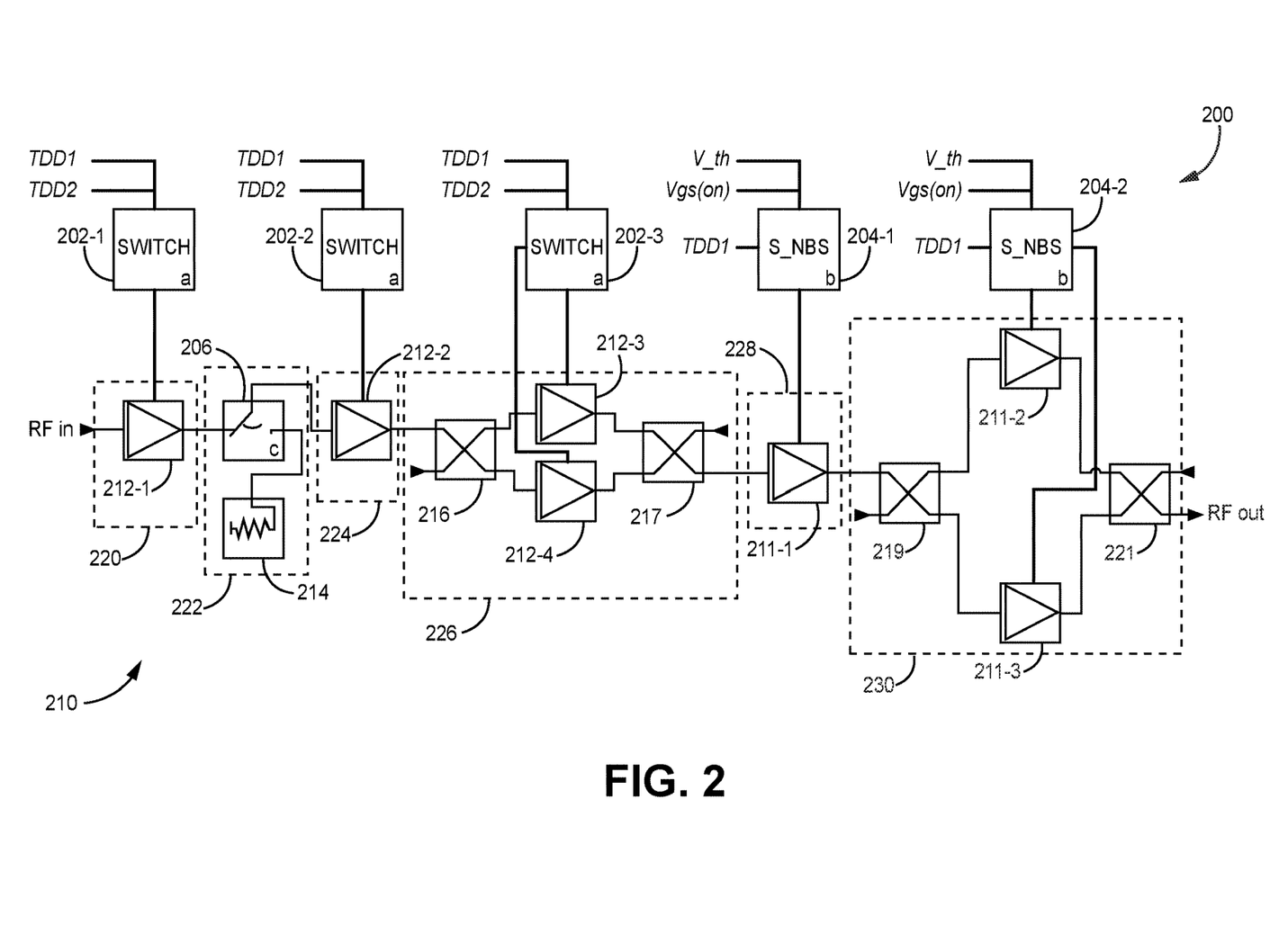
FIG. 2 is a schematic diagram of a sequenced transmit muting wideband power amplifier according to one exemplary embodiment.

An example embodiment of a power amplifier 200 is illustrated in FIG. 2. As illustrated, power amplifier 200 includes a first pre-driver stage 220, a second pre-driver stage 224, a third pre-driver stage 226, a driver stage 228 and a final amplifying stage 230. Also included in the power amplifier 200 are pre-driver switches 202-1, 202-2 and 202-3 and slow-NBS (S-NBS) switches 204-1 and 204-2.

The pre-driver stages 220, 224 and 226 include one or more pre-drivers 212 that are not identical and may be cascaded regarding their output power. In one embodiment, the pre-drivers 212 (transistors) are low noise amplifiers (LNA). The driver stage 228 and final amplifier stage 230 both include at least one driver 211 that are not identical and may be cascaded regarding their output power. In one embodiment drivers 211 are depletion mode gallium nitride (GaN) devices. A GaN depletion mode device (GaN transistor) generally has high efficiency, fast switching times and high-power density. Further, drivers 211-2 and 211-3 in the amplifier stage may be referred to as final amplifier drivers 211-2 and 211-3.

Signals TDD1 and TDD2 generated by the controller 150 are used to control the operation of the amplifier 200. As discussed in further detail below, the TDD1 signal is used to control the activation of S-NBS switches 204 to selectively couple negative voltages Vth and Vgs(on) (discussed below) to respective gates of drivers 211. The TDD2 signal is used in an embodiment to activate a mute switch 206 and activate pre-driver switches 202 to couple a supply voltage or ground to the pre-drivers 212.

The first pre-driver stage 220 includes a first pre-driver 212-1. The first pre-driver 212-1 has an input coupled to receive an RF input signal to the power amplifier 200. A first pre-driver switch 202-1 is coupled to a bias path of the first pre-driver 212-1. The second pre-driver stage 212-2 includes a second pre-driver 212-2. A second pre-driver switch 202-2 is coupled to a bias path of the second pre-driver 212-2. The mute switch 106 of a mute switch circuit 222 selectively couples an output of the first pre-driver circuit 212-1 or a termination resistor 214 to an input of the second pre-driver 212-2. In one example embodiment, the termination resistor 214 provides a 50 Ohm termination.

The third pre-driver stage 226 includes a signal splitter (coupler) 216 that splits an output of the second pre-driver 212-2 and couples the split output to inputs of parallel third and fourth pre-drivers 212-3 and 212-4 that form part of a balanced amplifier. The third pre-driver stage 226 further includes a signal combiner 217 that is coupled to combine the outputs of the pre-drivers 212-3 and 212-4. A third pre-driver switch 202-3 is coupled to the third and fourth pre-drivers 212-3 and 212-4.

An input of driver 211-1 of the driver stage 228 is coupled to an output of signal combiner 217 of the third pre-driver stage 226. S-NBS 204-1 selectively couples either V_th or Vgs(on) to a gate of driver 211-1 of the driver stage 228.

The final amplifier stage 230, in this embodiment, includes a signal splitter 219 that is coupled to split an output of driver 211-1 of the driver stage 228. Outputs of the signal splitter 219 are coupled to inputs of respective drivers 211-2 and 211-3 which are located in a Doherty configuration. S-NBS 204-2 selectively couples either V-th or Vgs(on) to gates of respective drivers 211-2 and 211-3. The final amplifier stage 230 further includes a signal combiner 221 with inputs coupled to respective outputs of drivers 211-2 and 211-3. In one embodiment, the signal combiner 221 is a Doherty combiner using a quarter-wave transformer and a 35 Ohm transmission line. An output of the signal combiner 221 is the RF output of the amplifier 200.

In the embodiment of FIG. 2, drivers 211-2 and 211-3 are in a Doherty architecture. Although a Doherty architecture is illustrated in the final amplifier stage 230, any known power amplifier architecture can be used in the final amplifier stage with minor changes, including but not limited to, balanced amplifiers, single-ended amplifiers, out-phasing amplifiers, linear amplifier using nonlinear components (LINC) amplifiers, etc.

As discussed above, embodiments use S-NBS 204 together with switches 202 in the bias paths of the pre-drivers 212 and an RF switch (mute switch) 206 between pre-driver stages 220 and 224 to control operation of the power amplifier 200. The slow response of the S-NBS 204-1 and 204-2 under high capacitive load is used in a convenient way in embodiments.

The speed of the S-NBS 204 strongly depends on the capacitive load, which is connected to a gate of the drivers 211 which are GaN devices in an embodiment. Tests have shown that a gate capacitance below 10 nF results in a switching transition time below 10 μs. A key feature of the GaN technology is high gain at lower frequencies. As consequence thereof, a proper decoupling of the transistors supply voltage and the RF path is necessary to stabilize the circuit. Cascaded blocking capacitors on the gate bias network, covering a range from 100 pF to several μF are suitable to ensure that unconditional stability. Furthermore, in some applications higher capacitances values may be needed to reach a desired performance.

When an S-NBS 204 is triggered, a working voltage is transmitted to a gate of drivers 211 as described below. The timing requirements for the TDD mode are given by the specification of the communication standard under use. For example the 4 G LTE/E-UTRA standards in ETSI TS 136 104 presents that the bidirectional transition time between Rx and Tx within the system should not exceed a maximum length of 17 μs. Further considering that the detection of the frame and the ramp up of the FET requires additional time, the maximum transition time for the amplifier equals 2 μs for both directions.

In embodiments, the controller 150 provides the two timely independent TDD trigger signals (TDD1 and TDD2) for the amplifier 200. In one embodiment TDD1 is used to trigger S-NBS switches 204 to activate or deactivate drivers 211 first and TDD2 is used to trigger the mute switch 106 and pre-driver switches 202 to activate or deactivate pre-drivers 112 at a select time after TDD1. This provides a sequenced switching consisting of two parts, a "soft turnover" initiated by TDD1 and a "hard turnover" initiated by TDD2.

The time sequencing for switching is determined by the at least one controller 150 in an embodiment. In one embodiment, when the power amplifier 200 is in a receive (Rx) mode (mute), a low signal is used for TDD1 and TDD2 and when the power amplifier 200 is in a transmit (Tx) mode, a high signal is used for TDD1 and TDD2. In this embodiment, a pulsed shape signal can be used for TDD1 and TDD2.

Figure 3:
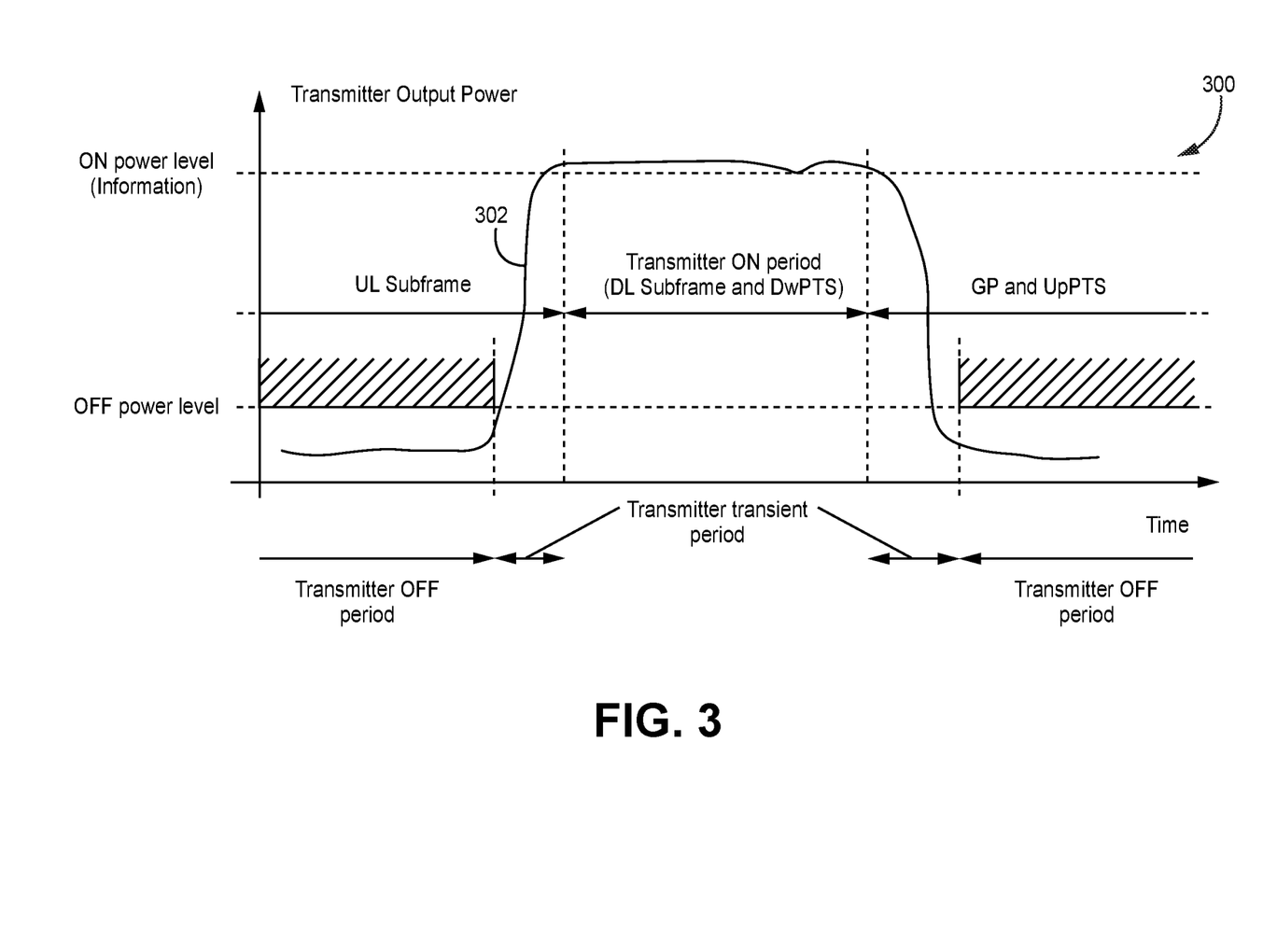
FIG. 3 illustrates a switching diagram according to one exemplary embodiment.

Sequencing may be used for both transitions (Tx-Rx/Rx-Tx) which is shown in switching diagram 300 of FIG. 3. In particular, switching diagram 300 illustrates the transmitter output level 302 during transmitter off periods, transmitter transient periods and a transmitter on period.

Figure 4A:
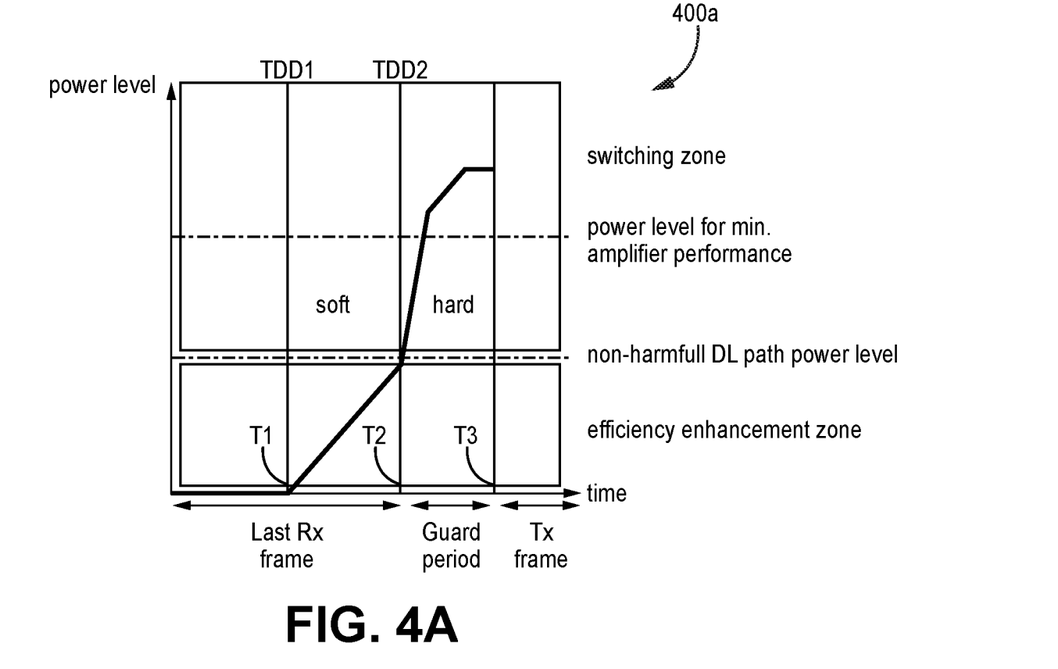
FIG. 4A illustrates a sequence Rx to Tx switching diagram according to one exemplary embodiment.
Figure 5A:
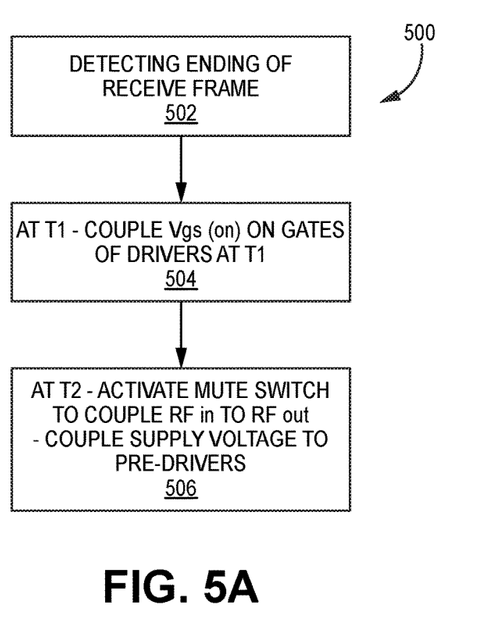
FIG. 5A illustrates a Rx to Tx flow diagram according to one exemplary embodiment.

A sequence Rx to Tx switching diagram 400A of an embodiment is illustrated in FIG. 4A. The sequence Rx to Tx switching diagram 400A sets out the switching of the amplifier 200 from a mute mode to a transmitting mode. FIG. 4A is described along with a description of steps illustrated in FIG. 5A. FIG. 5A sets out steps taken in a sequence in an Rx to Tx flow diagram 500. The sequential order may be different in the other embodiments. Hence embodiments are not limited to the sequential order set out in FIG. 5A.

When the TDD signal generator 150 (such as controller 150 in remote antenna unit 104) detects an ending receive frame at step (502), a TDD1 signal is generated at T1. The TDD1 signal causes the S-NBS switches 204-1 and 204-2 to coupled voltage Vgs(on) to the gates of the drivers 211 of driver stage 228 and final amplifier stage 230 as indicated at step (504). Vgs(on) is a negative voltage which is larger than a cut off voltage of the drivers 211 (transistors). When this voltage is applied to the gate of the drivers 211, each driver 211 is operated in its conducting region Id>0. Hence, the drivers are activated by the application of Vgs(on) on their respective gates. In the embodiment that uses GaN devices for drivers 211, Vth<Vcuttoff<Vgs(on)<0 (examples of voltages include −5<−3V<−2.75V<0V). Due to the slow time constant of the S-NBS switches 204-1 and 204-2, the drivers 211 still allow the transmission of a remaining part of the receive frame as the power level decreases (i.e. "soft turnover").

At a select time T2, a start of the guard period begins. The TDD2 signal is triggered with the start of the guard period. The TDD2 signal causes the mute switch 206 to couple the "RF in" to the "RF out" (i.e., coupling an output of the first pre-driver stage 220 to the second pre-driver stage 224). The TDD2 signal also causes the pre-driver switches 202 to pull a supply voltage on to the pre-drivers 212. This set out in step (506) of FIG. 5A. In one example embodiment, the supply voltage is 5 volts. The amplifier 200 is then in transmit mode and can transmit a transmit frame at T3.

Figure 4B:
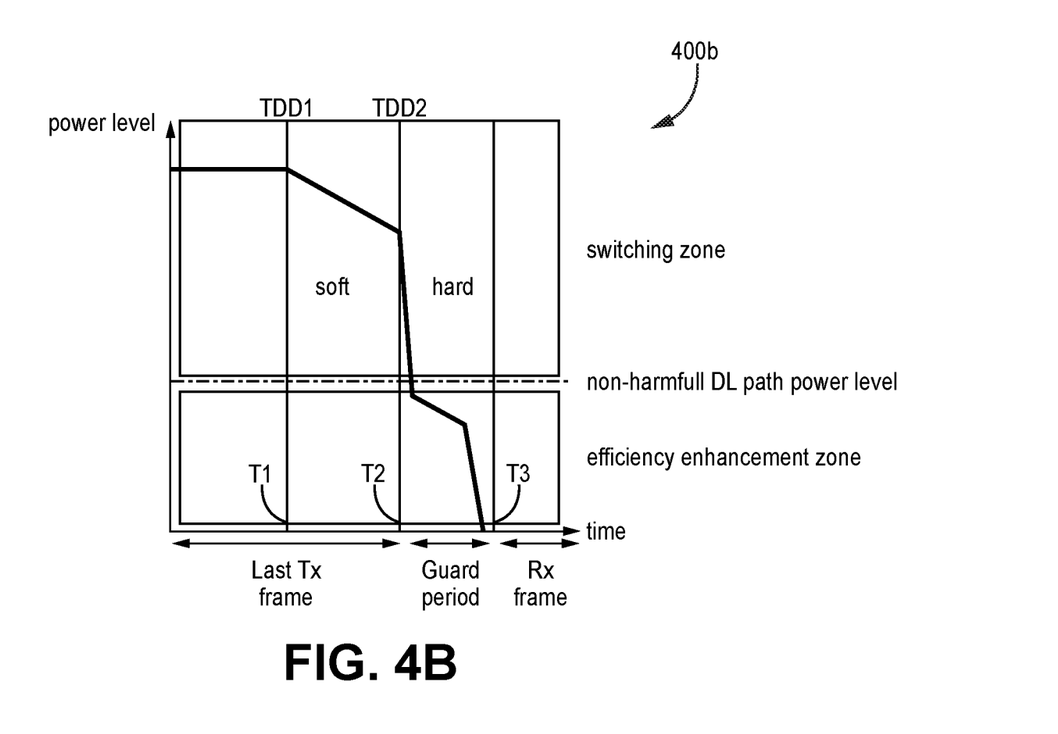
FIG. 4B illustrates a sequence Tx to Rx switching diagram according to one exemplary embodiment.
Figure 5B:
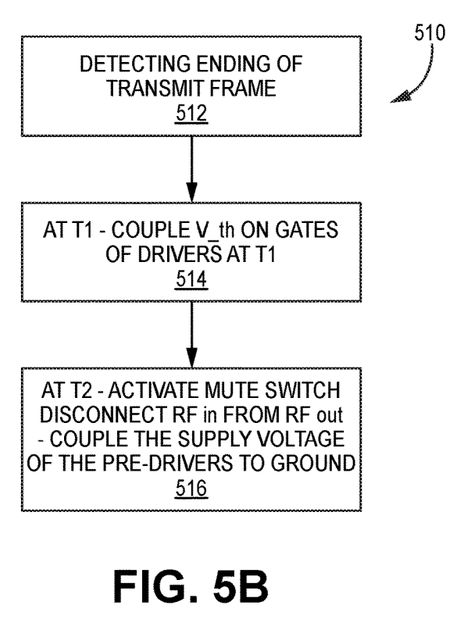
FIG. 5B illustrates a Tx to Rx flow diagram according to one exemplary embodiment.

Sequence Tx to Rx switching diagram 400B of FIG. 4B illustrates the sequence of switching of the amplifier 200 from transmitting to a mute mode used when the system is receiving. FIG. 4B is described along with a description of steps in FIG. 5B. FIG. 5B sets out steps taken in a sequence in a Tx to Rx flow diagram 510. The sequential order may be different in the other embodiments. Hence embodiments are not limited to the sequential order set out in FIG. 5B.

When the TDD signal generator 150 (such as controller 150 of a remote antenna unit 104) detects an ending transmit frame at step (512), the TDD1 signal is generated at T1. The TDD1 signal causes S-NBS 204-1 and 204-2 to couple V_th to the gates of drivers 211 of the driver stage 228 and final amplifier stage 230 as set out in step (514). V_th is a negative voltage below the cut off voltage of the driver (transistor) 211. The coupling of the V_th to the gates of the drivers 211 prevents the drivers 211 from conducting. At a select time T2, the TDD2 signal is generated in parallel to the start of the guard period and triggers the "hard turnover." The TDD2 signal causes the mute switch 206 to disconnect the RF in to the RF out and terminate the input of the second per-driver 212-2 to a select resistance. An example of the select resistance is 50 Ohms. The TDD2 signal further causes the pre-driver switches 202 to couple the supply voltage of the pre-drivers 202 to ground as set out in step (516). At the moment when the guard period begins, the power level of the Tx path is at a non-harmful level for the uplink path. The amplifier 200 is now in mute mode and receiving a receiving frame can occur at T3. Triggering the mute switch 206 allows the amplifier 200 to meet a non-harmful power level of 10 dB signal to noise ratio. By using a LNA as pre-driver 212-2 after the mute switch 206, the noise level at the output of the receiving path is minimized. The remaining time within the guard period can be used to increase amplifiers efficiency by switching off the remaining pre-drivers 212.

Due to the combination of S-NBS switches 204-1 and 204-2 and muting switch 206, the timing requirement within the guard period is effectively relaxed. This lower time requirement allows for much more of a capacitive load to be presented on the gate bias lines. Capacitive load is necessary for an unconditionally stable amplifier. Hence, embodiments provide an amplifier that does not need additional stabilization circuitry therein saving space. Further, in embodiments the capacitances can be adjusted as needed to reach a desired amplifier performance. In addition, embodiments of the amplifier can be used for both FDD and TDD. Hence, new amplifier variants do not need to be developed separately.

As discussed above, amplifier embodiments have increased efficiency in TDD mode. The increased "off" times of the drivers 211 result in a lower time average current which increases the efficiency. Switching the pre-drivers within the remaining time of the guard period rises the efficiency by an additional factor. Further, in embodiments a control circuit (such as the FPGA discussed above) is frequency independent and is able to cover timing requirements within all known mobile communication bands. The broadband performance is only limited by matching and performance of the amplification stages themselves.

Although embodiments of a sequenced muting power amplifier are described above as being used in a DAS, it is to be understood that embodiments of a sequenced muting power amplifier can be used in other ways. For example, embodiments of a sequenced muting power amplifier can be used in a single-node repeater. One example of such a single-node repeater 600 is shown in FIG. 6.

Figure 6:
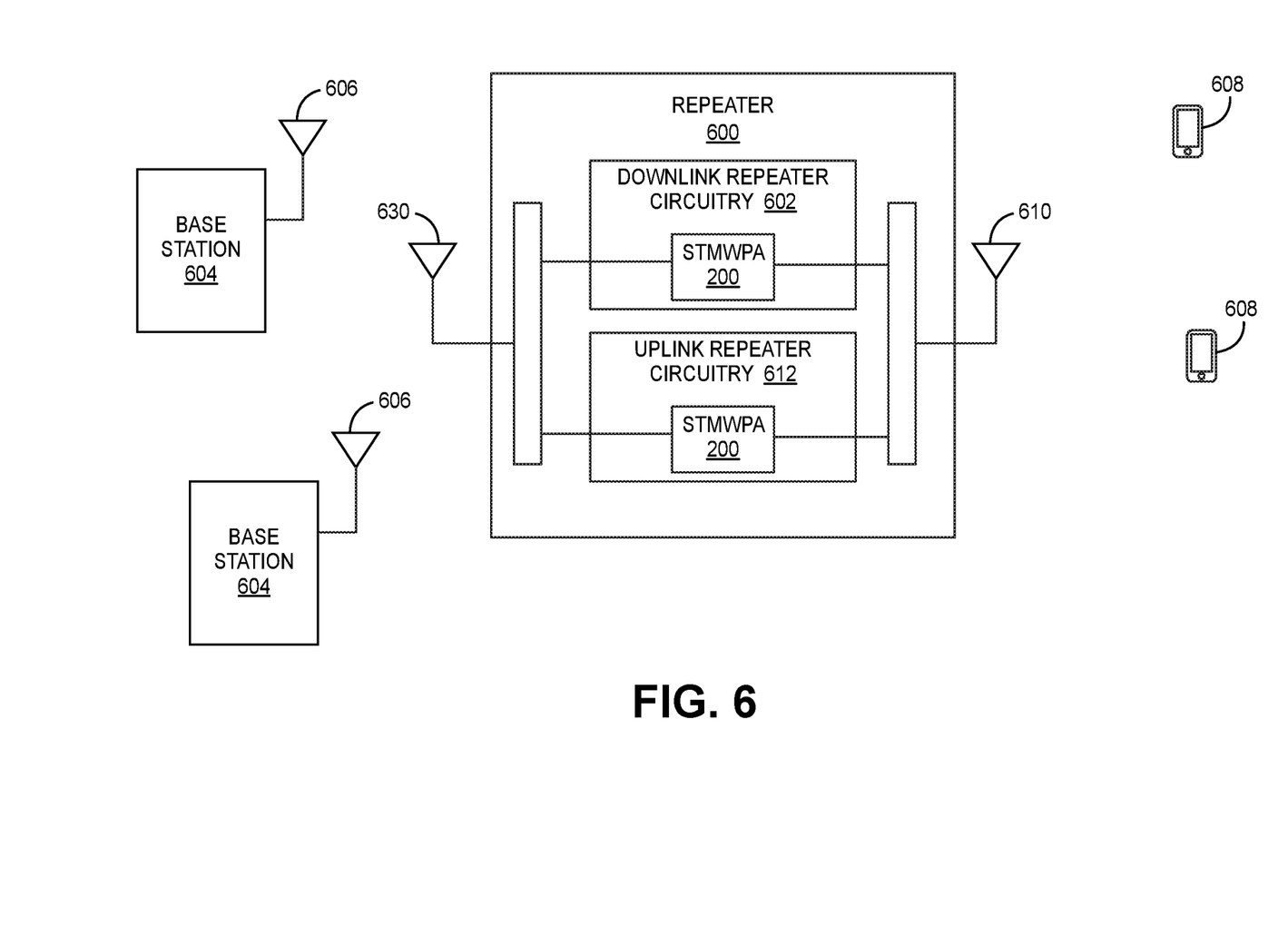
FIG. 6 is a block diagram of a single-node repeater according to one exemplary embodiment.

In general, the single-node repeater 600 shown in FIG. 6 comprises downlink repeater circuitry 602 that is configured to receive one or more downlink signals from one or more base stations 604 via one or more donor antennas 630 included in or coupled to the repeater 600. These signals are also referred to here as "base station downlink signals." Each base station downlink signal includes one or more radio frequency channels used for communicating in the downlink direction with user equipment (UE) 608 over the relevant wireless air interface. Typically, each base station downlink signal is received as an analog radio frequency signal.

The downlink repeater circuitry 602 in the repeater 600 is also configured to generate one or more downlink radio frequency signals that are radiated from one or more coverage antennas 610 included in or coupled to the repeater 600 for reception by user equipment 608. These downlink radio frequency signals are analog radio frequency signals and are also referred to here as "repeated downlink radio frequency signals." Each repeated downlink radio frequency signal includes one or more of the downlink radio frequency channels used for communicating with user equipment 608 over the wireless air interface. In this exemplary embodiment, the repeater 600 is an active repeater system in which the downlink repeater circuitry 602 comprises one or more amplifiers (or other gain elements) that are used to control and adjust the gain of the repeated downlink radio frequency signals radiated from the one or more coverage antennas 610. In particular, the downlink repeater circuitry 602 comprises one or more sequenced transmit muting wideband power amplifiers 200 (power amplifiers) as described above.

The downlink RF signals received via the donor antenna 630 are then repeated by the repeater system 600. In the uplink direction, uplink RF signals repeated by the repeater system 600 are transmitted from the repeater system 600 and the donor antenna 630 for reception by the one or more base stations 604 via co-located base station antenna systems 606.

Also, the single-node repeater 600 comprises uplink repeater circuitry 612 that is configured to receive one or more uplink radio frequency signals transmitted from the user equipment 608 via one or more of the coverage antennas 610. These signals are analog radio frequency signals and are also referred to here as "UE uplink radio frequency signals." Each UE uplink radio frequency signal includes one or more radio frequency channels used for communicating in the uplink direction with user equipment 608 over the relevant wireless air interface.

The uplink repeater circuitry 612 in the repeater 600 is also configured to generate one or more uplink radio frequency signals that are radiated from one or more of the donor antennas 630 to the one or more base stations 604. These signals are also referred to here as "repeated uplink signals." Each repeated uplink signal includes one or more of the uplink radio frequency channels used for communicating with user equipment 608 over the wireless air interface. In this exemplary embodiment, the repeater 600 is an active repeater system in which the uplink repeater circuitry 612 comprises one or more amplifiers (or other gain elements) that are used to control and adjust the gain of the repeated uplink radio frequency signals provided to the one or more base stations 604. In particular, the uplink repeater circuitry 612 comprises one or more power amplifiers 200 as described above.

Although embodiments of a sequenced transmit muting power amplifier are described above as being used in repeater systems (such as a DAS or single-node repeater), it is to be understood that embodiments of a sequenced transmit muting power amplifier can be used in other ways. For example, base station systems (such as macro base stations, small cell base stations, and cloud or central radio access network (C-RAN) base station systems) can use embodiments of a sequenced muting power amplifier of the type described here. In other examples, devices that wirelessly communicate using unlicensed RF spectrum (for example, WiFi access point base stations) employ embodiments of a sequenced muting power amplifier of the type described here.

EXAMPLE EMBODIMENTS

Example 1 is a sequenced transmit muting wideband power amplifier. The power amplifier includes at least one pre-driver stage, a mute switch, at least one pre-driver switch, a driver stage, a final amplifier stage and at least one slow negative-bias switching (S-NBS) switch. The at least one pre-driver stage includes a transmit radio frequency (RF) input and at least a first pre-driver and a second pre-driver. The mute switch is configured to selectively establish a communication path between the first and second pre-drivers and couple the second pre-driver to a termination resistor. The at least one pre-driver switch is used to selectively couple a supply voltage and ground to the first and second pre-drivers. The driver stage is in communication with the at least one pre-driver stage. The driver stage includes at least one first driver. The final amplifier stage includes a transmit RF output and at least one second driver. The at least one S-NBS switch is configured to selectively couple one of a first voltage and a second voltage to the at least one first driver and at least one second driver. The at least one controller configured to activate the at least one pre-driver switch, the mute switch, the at least one S-NBS switch to selectively place the amplifier in one of a transmit mode and a mute mode.

Example 2, includes the power amplifier of Example 1, wherein the at least one controller is also configured upon detecting an ending receive frame to activate the at least one S-NBS switch to couple the first voltage to the gate of the at least one first and at least one second drivers. The at least one controller is further configured activate the mute switch to establish the communication path between the first and second pre-driver and activate the at least one pre-driver switch to couple the supply voltage to the first and second pre-drivers to turn on the first and second pre-drivers after a select period of time from the activation of the at least one S-NBS switch to place the amplifier in the transmit mode.

Example 3 includes the power amplifier of any of the Examples 1-2, wherein the at least one controller is also configured upon detecting an ending transmit frame to activate the at least one S-NBS switch to couple the second voltage to the gate of the at least one first and at least one second drivers. The at least one controller is further configured activate the mute switch to couple the second pre-driver to the terminal resistance and activate the at least one pre-driver switch to couple ground to the first and second pre-drivers to turn off the first and second pre-drivers after a select period of time from the activation of the at least one S-NBS switch to place the amplifier in the mute mode.

Example 4 includes the power amplifier of any of the Examples 1-3, wherein the at least one pre-driver stage further includes a first pre-driver stage including the first pre-driver, a second pre-driver stage including the second pre-driver and a third pre-driver. The third pre-driver stage includes a first signal splitter, a third pre-driver, a fourth pre-driver and a signal combiner. The first signal splitter is coupled to split an output of the second pre-driver amplifier of the second pre-driver stage. The third pre-driver and fourth pre-driver in a parallel configuration. Outputs of the first signal splitter are coupled to respective inputs of the third and fourth pre-drivers. The first signal combiner is configured to combine outputs of the third pre-driver and the fourth pre-driver. An output of the first signal combiner is coupled to an input of the first driver of the driver stage. The at least one pre-driver switch includes a first pre-driver switch to selectively couple a supply voltage and ground to the first pre-driver, a second pre-driver switch to selectively couple a supply voltage and ground to the second pre-driver, and a third switch to selectively coupled one of the supply voltage and ground to the third pre-driver and the fourth pre-driver, the at least one controller configured to activate the third pre-driver switch.

Example 5 includes the power amplifier of any of the Examples 1-4, wherein the at least one second driver of the final amplifier stage further includes a pair of second final amplifier drivers in a Doherty configuration, a second signal splitter and a Doherty combiner. The second signal splitter has an input that is coupled to an output of the first driver in the first driver stage. Outputs of the second signal splitter are coupled to respective inputs of the pair of second final amplifier drivers. The Doherty combiner has inputs that are coupled to respective outputs of the pair of second final amplifier drivers. An output of the Doherty combiner outputting the RF output signal.

Example 6 includes the power amplifier of any of the Examples 1-5, wherein the first and second pre-drivers are low noise amplifiers.

Example 7 includes the power amplifier of any of the Examples 1-7, wherein the first and at least one second driver is a Gallium Nitride (GaN) device.

Example 8 includes the power amplifier of any of the Examples 1-7, wherein the at least one controller is a field programmable gate array (FPGA) of one of a remote antenna unit in a distributed antenna system (DAS) and a repeater.

Example 9 includes a sequenced transmit muting wideband power amplifier. The power amplifier comprising a first pre-driver stage, a first pre-driver switch, a second pre-driver stage, a mute switch, a second pre-driver switch, a driver stage, a first slow negative-bias-switching (S-NBS) switch, a final amplifier stage, a second S-NBS and at least one controller. The first pre-driver stage has a first pre-driver. The first pre-driver has an input that is coupled to receive a radio frequency (RF) input signal. The first pre-driver switch is configured to selectively couple one of a supply voltage and ground to the first pre-driver. The second pre-driver stage has a second pre-driver. The mute switch is configured to selectively couple an input of the second pre-driver to an output of the first pre-driver and the input of the second pre-driver to a termination resistor. The second pre-driver switch selectively couples one of the supply voltage and the ground to the second pre-driver amplifier. The driver stage includes a first driver that is in communication with an output of the second pre-driver stage. The first S-NBS switch is configured to selectively couple one of a first negative voltage and second negative voltage to a first driver gate of the first driver. The final amplifier stage has at least one second driver. The at least one second driver has an input that is coupled to an output of the first driver of the driver stage. The at least one second driver has an output that proves a RF output signal. The second S-NBS switch is configured to selectively couple one of the first negative voltage and the second negative voltage to a second driver gate of the second driver. The at least one controller is configured to activate the first pre-driver switch, the second pre-driver switch, the mute switch, the first S-NBS and the second S-NBS switches to selectively place the amplifier in one of a transmit mode and a mute mode.

Example 10 includes the power amplifier of Examples 9, further including a third pre-driver stage. The third pre-driver stage including a first signal splitter, a third pre-driver, a fourth driver, a first signal combiner and a third pre-driver switch. The first signal splitter is coupled to split an output of the second pre-driver amplifier of the second pre-driver stage. The third pre-driver and fourth pre-driver are in a parallel configuration. Outputs of the first signal splitter are coupled to respective inputs of the third and fourth pre-driver. The first signal combiner is configured to combine outputs of the third pre-driver and the fourth pre-driver. An output of the first signal combiner is coupled to an input of the first driver of the driver stage. The third pre-driver switch is used to selectively couple one of a supply voltage and ground to the third pre-driver and the fourth pre-driver. The at least one controller is configured to activate the third switch.

Example 11 includes the power amplifier of any of the Examples 9-10, wherein the at least one second driver of the final amplifier stage further includes a pair of second final amplifier drivers in a Doherty configuration, a second signal splitter and a Doherty combiner. The second signal splitter has an input that is coupled to an output of the first driver in the first driver stage. Outputs of the second signal splitter are coupled to respective inputs of the pair of second final amplifier drivers. The Doherty combiner has inputs that are coupled to respective outputs of the pair of second final amplifier drivers. An output of the Doherty combiner outputting the RF output signal.

Example 12 includes the power amplifier of any of the Examples 9-11, wherein the at least one controller is configured, upon detecting an end of a receive frame, to activate the first and second S-NBS switches to couple the first negative voltage to the first driver gate and the second driver gate of the respective first and at least one second drivers. The at least one controller is further configured activate the mute switch to couple the input of the second pre-driver to the output of the first pre-drive and activate the first and second pre-driver switches to couple the supply voltage to the first and second pre-drivers after a select period of time from the activation of the first and second S-NBS switches to place the amplifier in the transmit mode.

Example 13 includes the power amplifier of any of the Examples 9-12, wherein the at least one controller is configured, upon detecting an ending transmit frame, to activate the first and second S-NBS switches to couple the second negative voltage to the first driver gate and the second driver gate of the respective first and at least one second drivers. The at least one controller is further configured to activate the mute switch to connect the input of the second pre-driver to the termination resistor and activate the first and second pre-driver switches to couple a ground to the first and second pre-driver after a select period of time from the activation of the first and second S-NBS switches to place the amplifier in the mute mode.

Example 14 includes the power amplifier of any of the Examples 9-13, wherein the first and second pre-drivers are low noise amplifiers and the first and at least one second driver are Gallium Nitride (GaN) depletion devices.

Example 15 includes the power amplifier of any of the Examples 9-14, wherein the power amplifier is part of a transmit system in one of a remote antenna unit in a distributed antenna system (DAS) and a repeater.

Example 16 is a method of operating a sequenced transmit muting wideband power amplifier in a time division duplex communication system. The method includes upon detecting an end of a receive frame, activating at least one negativebias-switching (S-NBS) switch to couple a select first voltage on gates of drivers in a driver stage and a final amplifier stage of the amplifier; activating a mute switch to establish a communication path between a radio frequency (RF) input and a RF output after a select period of time from the activation of the at least one S-NBS switch; and activating first and second pre-driver switches to couple a supply voltage to a first and a second pre-driver that are within the communication path after the select period of time from the activation of the at least one S-NBS switch to place the amplifier in the transmit mode.

Example 17 includes the method of Example 16, wherein the select first voltage is a negative voltage that is larger than a cut off voltage of drivers so the drivers are operated in there conductive region.

Example 18 includes the method of any of the Examples 16-17, further including upon detecting an end of a transmit frame, activating the at least one S-NBS switch to couple a select second voltage on the gates of the drivers in the driver stage and the final amplifier stage of the amplifier; activating the mute switch to disconnect the communication path between the RF input and the RF output after a select period of time from the activation of the at least one S-NBS switch; and activating the first and second pre-driver switches to couple ground to a first and a second pre-driver after the select period of time from the activation of the at least one S-NBS switch to place the amplifier in the mute mode.

Example 19 includes the method of Example 18, wherein the select second voltage is a negative voltage that is below a cut off voltage of drivers so the drivers are not conducting.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A sequenced transmit muting wideband power amplifier, the power amplifier comprising:
    at least one pre-driver stage including a transmit radio frequency (RF) input and at least a first pre-driver and a second pre-driver;
    a mute switch configured to selectively establish a communication path between the first and second pre-drivers and couple the second pre-driver to a termination resistor;
    at least one pre-driver switch to selectively couple a supply voltage and ground to the first and second pre-drivers;
    a driver stage in communication with the at least one pre-driver stage, the driver stage including at least one first driver;
    a final amplifier stage including a transmit RF output and at least one second driver;
    at least one slow negative-bias-switching (S-NBS) switch configured to selectively couple one of a first voltage and a second voltage to the at least one first driver and at least one second driver; and
    at least one controller configured to activate the at least one pre-driver switch, the mute switch, the at least one S-NBS switch to selectively place the amplifier in one of a transmit mode and a mute mode.

2. The power amplifier of claim 1, wherein the at least one controller is also configured upon detecting an ending receive frame to activate the at least one S-NBS switch to couple the first voltage to the gate of the at least one first and at least one second drivers, the at least one controller further configured activate the mute switch to establish the communication path between the first and second pre-driver and activate the at least one pre-driver switch to couple the supply voltage to the first and second pre-drivers to turn on the first and second pre-drivers after a select period of time from the activation of the at least one S-NBS switch to place the amplifier in the transmit mode.

3. The power amplifier of claim 1, wherein the at least one controller is configured upon detecting an ending transmit frame to activate the at least one S-NBS switch to couple the second voltage to the gate of the at least one first and at least one second drivers, the at least one controller further configured activate the mute switch to couple the second pre-driver to the terminal resistance and activate the at least one pre-driver switch to couple ground to the first and second pre-drivers to turn off the first and second pre-drivers after a select period of time from the activation of the at least one S-NBS switch to place the amplifier in the mute mode.

4. The power amplifier of claim 1, wherein the at least one pre-driver stage further comprises:
    a first pre-driver stage including the first pre-driver;
    a second pre-driver stage including the second pre-driver;
    a third pre-driver stage, the third pre-driver stage including,
        a first signal splitter coupled to split an output of the second pre-driver of the second pre-driver stage;
        a third pre-driver amplifier and fourth pre-driver amplifier in a parallel configuration, outputs of the first signal splitter coupled to respective inputs of the third and fourth pre-driver amplifiers;
        a first signal combiner configured to combine outputs of the third pre-driver amplifier and the fourth pre-driver amplifier, an output of the first signal combiner coupled to an input of the first driver of the driver stage;
    the at least one pre-driver switch including,
        a first pre-driver switch to selectively couple a supply voltage and ground to the first pre-driver,
        a second pre-driver switch to selectively couple a supply voltage and ground to the second pre-driver, and
        a third switch to selectively coupled one of the supply voltage and ground to the third pre-driver and the fourth pre-driver, the at least one controller configured to activate the third pre-driver switch.

5. The power amplifier of claim 1, wherein the at least one second driver of the final amplifier stage further includes:
    a pair of second final amplifier drivers in a Doherty configuration;
    a second signal splitter having an input coupled to a output of the first driver in the first driver stage, outputs of the second signal splitter coupled to respective inputs of the pair of second final amplifier drivers; and
    a Doherty combiner having inputs coupled to respective outputs of the pair of second final amplifier drivers, an output of the Doherty combiner outputting the RF output signal.

6. The power amplifier of claim 1, wherein the first and second pre-drivers are low noise amplifiers.

7. The power amplifier of claim 1, wherein the first and at least one second driver is a Gallium Nitride (GaN) device.

8. The power amplifier of claim 1, wherein the at least one controller is a field programmable gate array (FPGA) of one of a remote antenna unit in a distributed antenna system (DAS) and a repeater.

9. A sequenced transmit muting wideband power amplifier, the power amplifier comprising;
- a first pre-driver stage having a first pre-driver, the first pre-driver having an input coupled to receive an radio frequency (RF) input signal;
- a first pre-driver switch configured to selectively coupled one of a supply voltage and ground to the first pre-driver;
- a second pre-driver stage having a second pre-driver;
- a mute switch configured to selectively couple an input of the second pre-driver to an output of the first pre-driver and the input of the second pre-driver to a termination resistor;
- a second pre-driver switch to selectively coupled one of the supply voltage and the ground to the second pre-driver amplifier;
- a driver stage, the driver stage including a first driver that is in communication with an output of the second pre-driver stage;
- a first slow negative-bias-switching (S-NBS) switch configured to selectively couple one of a first negative voltage and second negative voltage to a first driver gate of the first driver;
- a final amplifier stage having at least one second driver, the at least one second driver having an input coupled to an output of the first driver of the driver stage, the at least one second driver providing a RF output signal;
- a second S-NBS switch configured to selectively couple one of the first negative voltage and the second negative voltage to a second driver gate of the second driver; and
- at least one controller configured to activate the first pre-driver switch, the second pre-driver switch, the mute switch, the first S-NBS and the second S-NBS switches to selectively place the amplifier in one of a transmit mode and a mute mode.

10. The power amplifier of claim 9, further comprising:
- a third pre-driver stage including,
  - a first signal splitter coupled to split an output of the second pre-driver amplifier of the second pre-driver stage;
  - a third pre-driver and fourth pre-driver in a parallel configuration, outputs of the first signal splitter coupled to respective inputs of the third and fourth pre-drivers;
  - a first signal combiner configured to combine outputs of the third pre-driver and the fourth pre-driver, an output of the first signal combiner coupled to an input of the first driver of the driver stage; and
- a third pre-driver switch to selectively couple one of a supply voltage and ground to the third pre-driver and the fourth pre-driver, the at least one controller configured to activate the third switch.

11. The power amplifier of claim 9, wherein the at least one second driver of the final amplifier stage further comprises:
- a pair of second final amplifier drivers in a Doherty configuration;
- a second signal splitter having an input coupled to an output of the first driver in the first driver stage, outputs of the second signal splitter coupled to respective inputs of the pair of second final amplifier drivers; and
- a Doherty combiner having inputs coupled to respective outputs of the pair of second final amplifier drivers, an output of the Doherty combiner outputting the RF output signal.

12. The power amplifier of claim 9, wherein the at least one controller is configured upon detecting an end of a receive frame to activate the first and second S-NBS switches to couple the first negative voltage to the first driver gate and the second driver gate of the respective first and at least one second drivers, the at least one controller further configured activate the mute switch to couple the input of the second pre-driver to the output of the first pre-drive and activate the first and second pre-driver switches to couple the supply voltage to the first and second pre-drivers after a select period of time from the activation of the first and second S-NBS switches to place the amplifier in the transmit mode.

13. The power amplifier of claim 9, wherein the at least one controller is configured upon detecting an ending transmit frame to activate the first and second S-NBS switches to couple the second negative voltage to the first driver gate and the second driver gate of the respective first and at least one second drivers, the at least one controller further configured to activate the mute switch to connect the input of the second pre-driver to the termination resistor and activate the first and second pre-driver switches to couple a ground to the first and second pre-driver after a select period of time from the activation of the first and second S-NBS switches to place the amplifier in the mute mode.

14. The power amplifier of claim 9, wherein the first and second pre-drivers are low noise amplifiers and the first and at least one second driver are Gallium Nitride (GaN) depletion devices.

15. The power amplifier of claim 9, wherein the power amplifier is part of a transmit system in one of a remote antenna unit in a distributed antenna system (DAS) and a repeater.

16. A method of operating a sequenced transmit muting wideband power amplifier in a time division duplex communication system, the method comprising:
- upon detecting an end of a receive frame, activating at least one negative-bias-switching (S-NBS) switch to couple a select first voltage on gates of drivers in a driver stage and a final amplifier stage of the amplifier;
- activating a mute switch to establish a communication path between a radio frequency (RF) input and a RF output after a select period of time from the activation of the at least one S-NBS switch; and
- activating first and second pre-driver switches to couple a supply voltage to a first and a second pre-driver that are within the communication path after the select period of time from the activation of the at least one S-NBS switch to place the amplifier in the transmit mode.

17. The method of claim 16, wherein the select first voltage is a negative voltage that is larger than a cut off voltage of drivers so the drivers are operated in there conductive region.

18. The method of claim 16, further comprising:
- upon detecting an end of a transmit frame, activating the at least one S-NBS switch to couple a select second voltage on the gates of the drivers in the driver stage and the final amplifier stage of the amplifier;
- activating the mute switch to disconnect the communication path between the RF input and the RF output after a select period of time from the activation of the at least one S-NBS switch; and
- activating the first and second pre-driver switches to couple ground to a first and a second pre-driver after the select period of time from the activation of the at least one S-NBS switch to place the amplifier in the mute mode.

19. The method of claim 18, wherein the select second voltage is a negative voltage that is below a cut off voltage of drivers so the drivers are not conducting.

\* \* \* \* \*